(12) United States Patent
Nishikawa et al.

(10) Patent No.: US 7,794,667 B2
(45) Date of Patent: Sep. 14, 2010

(54) GAS RING AND METHOD OF PROCESSING SUBSTRATES

(75) Inventors: Katsuhito Nishikawa, Oakdale, CA (US); Gary M. Moore, San Francisco, CA (US); Aaron David Ingles, Stockton, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 1315 days.

(21) Appl. No.: 11/254,294

(22) Filed: Oct. 19, 2005

(65) Prior Publication Data

US 2007/0087533 A1    Apr. 19, 2007

(51) Int. Cl.
*B01J 19/00* (2006.01)
*H01L 21/20* (2006.01)
*H01L 21/36* (2006.01)

(52) U.S. Cl. ............................ 422/129; 438/478
(58) Field of Classification Search .............. 422/129; 438/478
See application file for complete search history.

(56) References Cited

U.S. PATENT DOCUMENTS

| | | | |
|---|---|---|---|
| 3,424,629 A | 1/1969 | Ernst et al. ............... 148/175 |
| 3,603,284 A | 9/1971 | Garnache .................... 118/48 |
| 3,608,519 A | 9/1971 | Bean et al. .................. 118/48 |
| 3,637,434 A | 1/1972 | Nakanuma et al. ......... 117/201 |
| 3,719,166 A | 3/1973 | Gereth ....................... 118/48 |
| 4,220,116 A | 9/1980 | Hochberg ................. 118/715 |
| 4,716,852 A | 1/1988 | Tsujii et al. .............. 118/720 |
| 4,745,088 A | 5/1988 | Inoue et al. ............... 437/102 |
| 4,794,220 A | 12/1988 | Sekiya ................. 219/10.491 |
| 4,807,562 A | 2/1989 | Sandys .................... 118/725 |
| 4,848,272 A | 7/1989 | Ohmura et al. ........... 118/725 |
| 5,038,711 A | 8/1991 | Dan et al. ................ 118/715 |
| 5,053,247 A | 10/1991 | Moore ........................ 427/55 |
| 5,108,792 A * | 4/1992 | Anderson et al. ......... 427/248.1 |
| 5,133,561 A | 7/1992 | Hattori et al. |
| 5,207,835 A | 5/1993 | Moore ....................... 118/725 |
| 5,275,686 A * | 1/1994 | Schaus et al. .............. 117/93 |
| 5,368,648 A | 11/1994 | Sekizuka |
| 5,444,217 A | 8/1995 | Moore et al. .............. 219/405 |
| 5,468,298 A | 11/1995 | Lei et al. |
| 5,580,388 A | 12/1996 | Moore ....................... 118/728 |
| 5,601,107 A | 2/1997 | Moore et al. ............... 137/15 |
| 5,683,516 A | 11/1997 | DeDontney et al. ........ 118/718 |
| 5,683,518 A | 11/1997 | Moore et al. .............. 118/730 |
| 5,710,407 A | 1/1998 | Moore et al. .............. 219/405 |
| 5,746,834 A | 5/1998 | Hanley ..................... 118/715 |
| 5,802,099 A | 9/1998 | Curran et al. .............. 374/131 |

(Continued)

FOREIGN PATENT DOCUMENTS

EP        0 308 946        9/1988

(Continued)

*Primary Examiner*—Walter D Griffin
*Assistant Examiner*—Natasha Young
(74) *Attorney, Agent, or Firm*—Gunnison, McKay & Hodgson, L.L.P.; Serge J. Hodgson

(57) ABSTRACT

A process gas to a reactor volume of a semiconductor processing reactor is provided through gas injector ports of a gas ring. The process gas flows horizontally from the gas injector ports across a principal surface of a rotating susceptor to exhaust ports of the gas ring. The spent process gas is removed from the reactor volume through the exhaust ports.

36 Claims, 14 Drawing Sheets

U.S. PATENT DOCUMENTS

| | | | |
|---|---|---|---|
| 5,820,686 A | 10/1998 | Moore | 118/730 |
| 5,843,234 A | 12/1998 | Finn et al. | 118/715 |
| 5,872,632 A | 2/1999 | Moore | 356/381 |
| 5,916,369 A * | 6/1999 | Anderson et al. | 118/715 |
| 5,925,188 A | 7/1999 | Oh | 118/715 |
| 6,024,799 A | 2/2000 | Chen et al. | 118/715 |
| 6,475,284 B1 | 11/2002 | Moore et al. | 118/715 |
| 2003/0033982 A1 | 2/2003 | Faykosh et al. | |
| 2003/0092266 A1 | 5/2003 | Anderson et al. | |
| 2004/0217217 A1 * | 11/2004 | Han et al. | 239/589 |

FOREIGN PATENT DOCUMENTS

| | | |
|---|---|---|
| EP | 0 636 704 | 2/1995 |
| GB | 1 375 942 | 12/1974 |
| JP | 60-250631 | 12/1985 |
| JP | 01-134911 | 5/1989 |
| WO | WO-99/07925 | 2/1999 |
| WO | WO-01/34871 | 5/2001 |

* cited by examiner

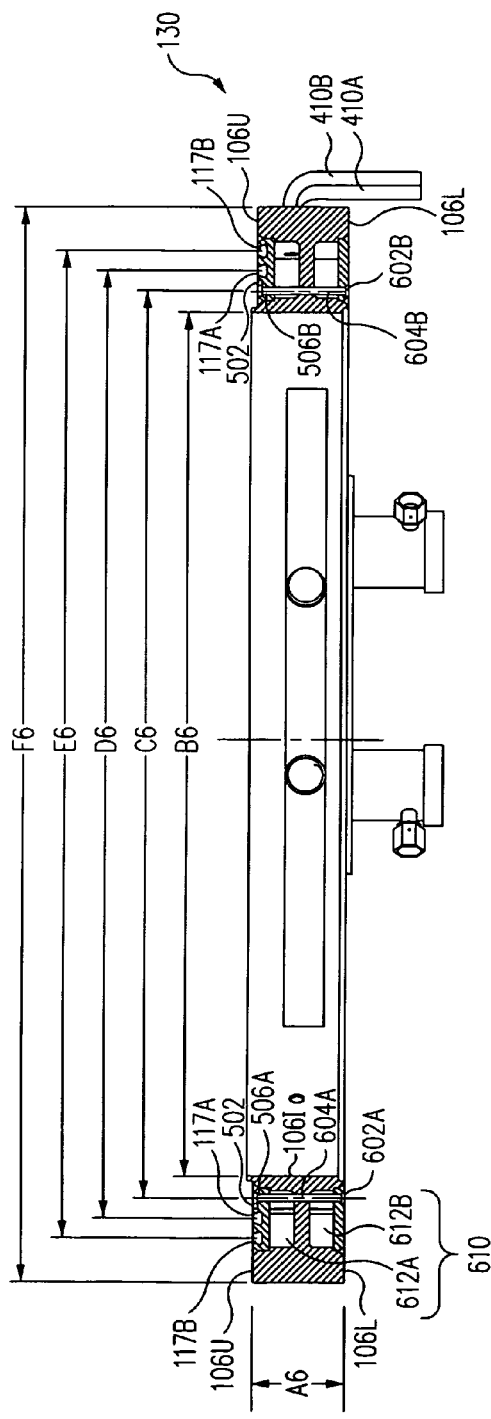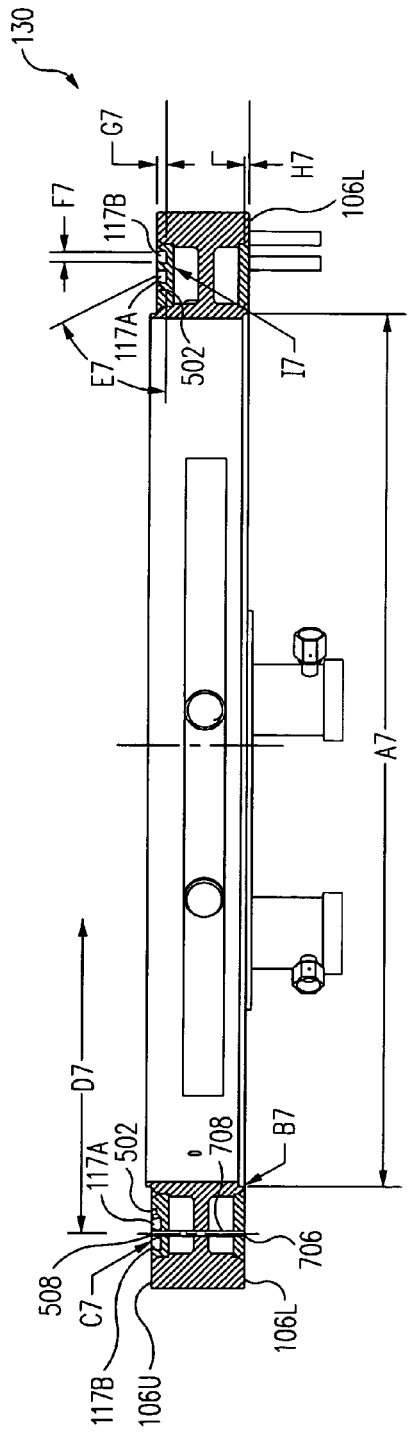

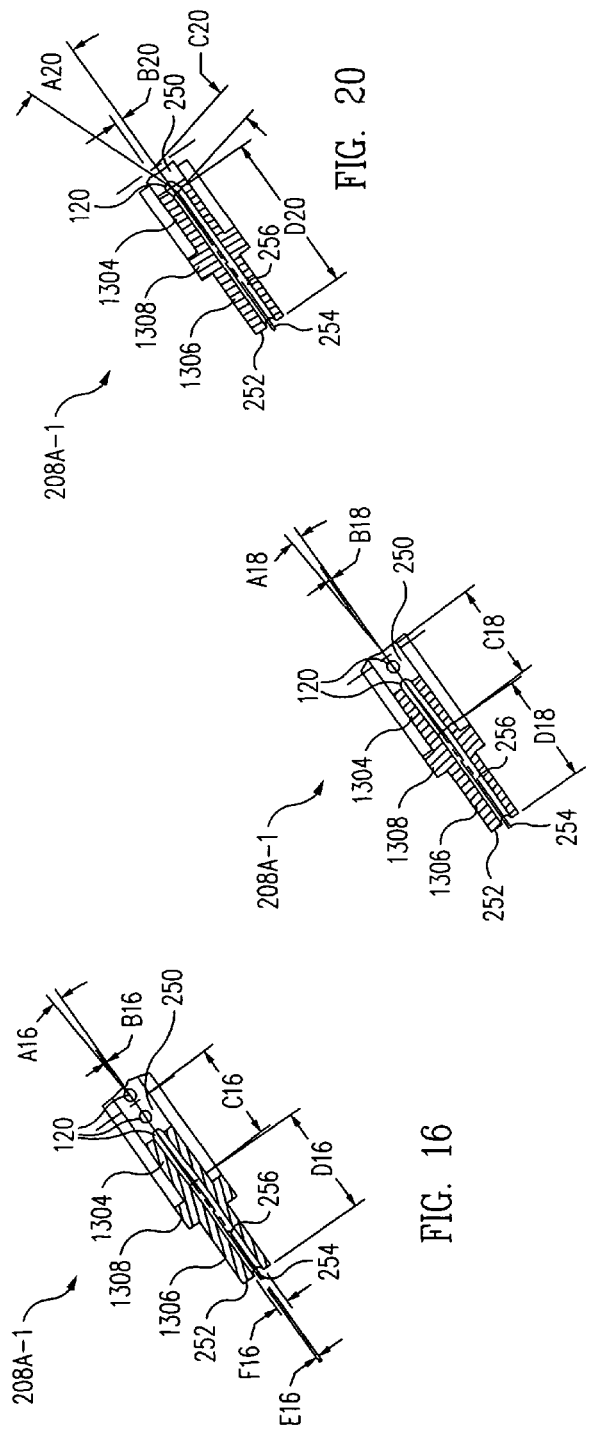
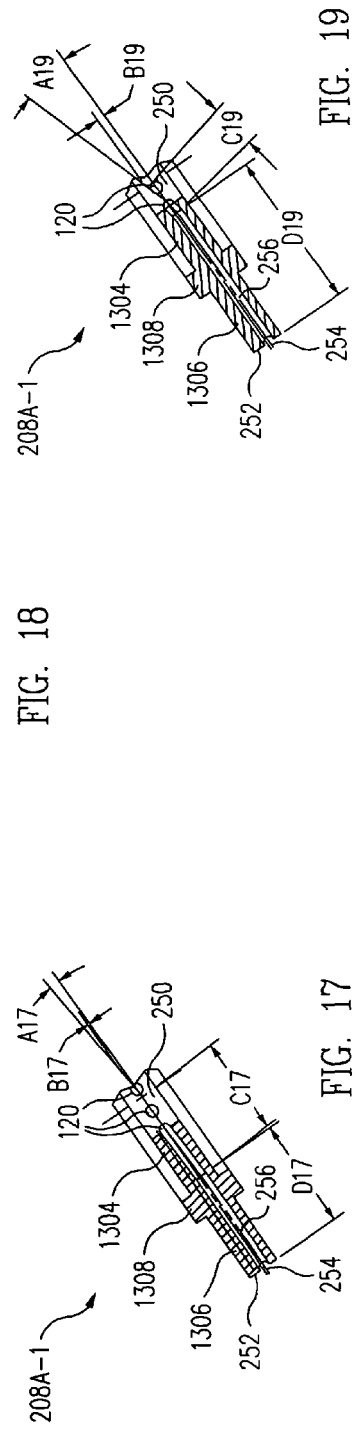

GAS RING AND METHOD OF PROCESSING SUBSTRATES

BACKGROUND OF THE INVENTION

1. Field of the Invention

The present invention relates generally to semiconductor processing equipment. More particularly, the present invention relates to a gas ring for a pancake reactor and to a method for using the same.

2. Description of Related Art

As is well known to those of skill in the art, substrate processing typically involved the formation of one or more layers on substrates. Generally, substrates, e.g., silicon wafers, were placed on a susceptor in a semiconductor processing reactor. Process gas was introduced into the semiconductor processing reactor, and a layer was formed on the substrates from the process gas.

To insure uniformity in the characteristics of the substrates, it was important that the formed layer was uniform, e.g., in thickness, across the substrates. To enhance the uniformity of the formed layer, the susceptor upon which the substrates were placed was typically rotated within the semiconductor processing reactor.

Further, the flow characteristics of the process gas through the semiconductor processing reactor was important. Typically, gas injectors located in and extending from the bottom of the semiconductor processing reactor injected the process gas upwards towards the dome of the semiconductor processing reactor above the susceptor. The process gas was then drawn down and around the susceptor to exhaust ports also located in the bottom of the semiconductor processing reactor. Thus, the process gas flow through the semiconductor processing reactor was turbulent and recirculatory. Due to the turbulent and recirculatory flow of process gas, particulates located within the semiconductor processing reactor has a tendency to become dislodged and contaminated the substrates.

Further, since all of the process gas had to flow pass the edge of the susceptor to the exhaust ports located in the bottom of the semiconductor processing reactor, the deposited layer was generally thicker near the edge of the susceptor and thinner near the center of the susceptor.

SUMMARY OF THE INVENTION

In accordance with one embodiment of the present invention, a gas ring includes at least one gas injector port and at least one gas exhaust port. The at least one gas injector port is opposite the at least one gas exhaust port.

A process gas to a reactor volume of a semiconductor processing reactor is provided through the at least one gas injector port of the gas ring. The process gas flows horizontally from the at least one gas injector port across a principal surface of a rotating susceptor to the at least one exhaust port. The spent process gas is removed from the reactor volume through the at least one exhaust port.

In one embodiment, the process gas flows horizontally with a laminar or non-turbulent flow, i.e., in a sheet-like flow. This results in the formation of layers on substrates having excellent thickness uniformity.

Further, by reducing or eliminating turbulence in the flow of the process gas through the reactor volume, dislodgement of particulates and the associated substrate contamination is minimized.

In addition, use of the gas ring allows realization of an abrupt transition between layers formed on the substrates.

Embodiment in accordance with the present invention will be more readily apparent from the detailed description set forth below taken in conjunction with the accompanying drawings.

BRIEF DESCRIPTION OF THE DRAWINGS

FIG. 6 is a cross-sectional view of the chassis along the line VI-VI of FIG. 5 in accordance with one embodiment of the present invention;

FIG. 7 is a cross-sectional view of the chassis along the line VII-VII of FIG. 5 in accordance with one embodiment of the present invention;

FIGS. 16, 17, 18, 19 and 20 are cross-sectional views of the gas injector head taken along the lines XVI-XVI, XVII-XVII, XVIII-XVIII, XIX-XIX, XX-XX of FIG. 14, respectively, in accordance with various embodiments of the present invention;

In the following description, the same or similar elements are labeled with the same or similar reference numbers.

DETAILED DESCRIPTION

Figure 1:
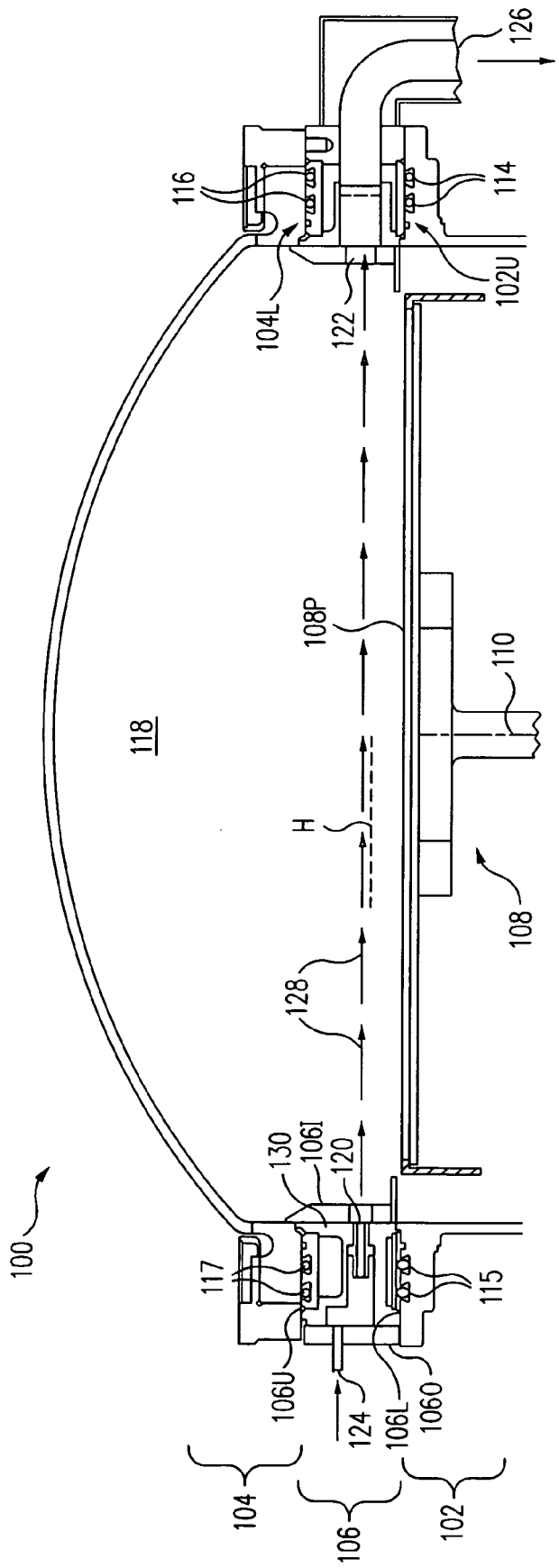
FIG. 1 is a side cross-sectional view of a pancake reactor in accordance with one embodiment of the present invention.

Referring to FIG. 1, a process gas to a reactor volume 118 of a semiconductor processing reactor 100 is provided through gas injector ports 120 of a gas ring 106. The process gas flows horizontally as indicated by arrows 128 from gas injector ports 120 across a principal surface 108P of a rotating susceptor 108 to gas exhaust ports 122 of gas ring 106. The spent process gas is removed from reactor volume 118 through gas exhaust ports 122.

In one embodiment, the process gas flows horizontally with a laminar or non-turbulent flow, i.e., in a sheet-like flow. This results in the formation of layers on substrates having excellent thickness uniformity.

Further, by reducing or eliminating turbulence in the flow of the process gas through reactor volume 118, dislodgement of particulates and the associated substrate contamination is minimized.

In addition, use of gas ring 106 allows realization of an abrupt transition between layers formed on the substrates.

Figure 2:
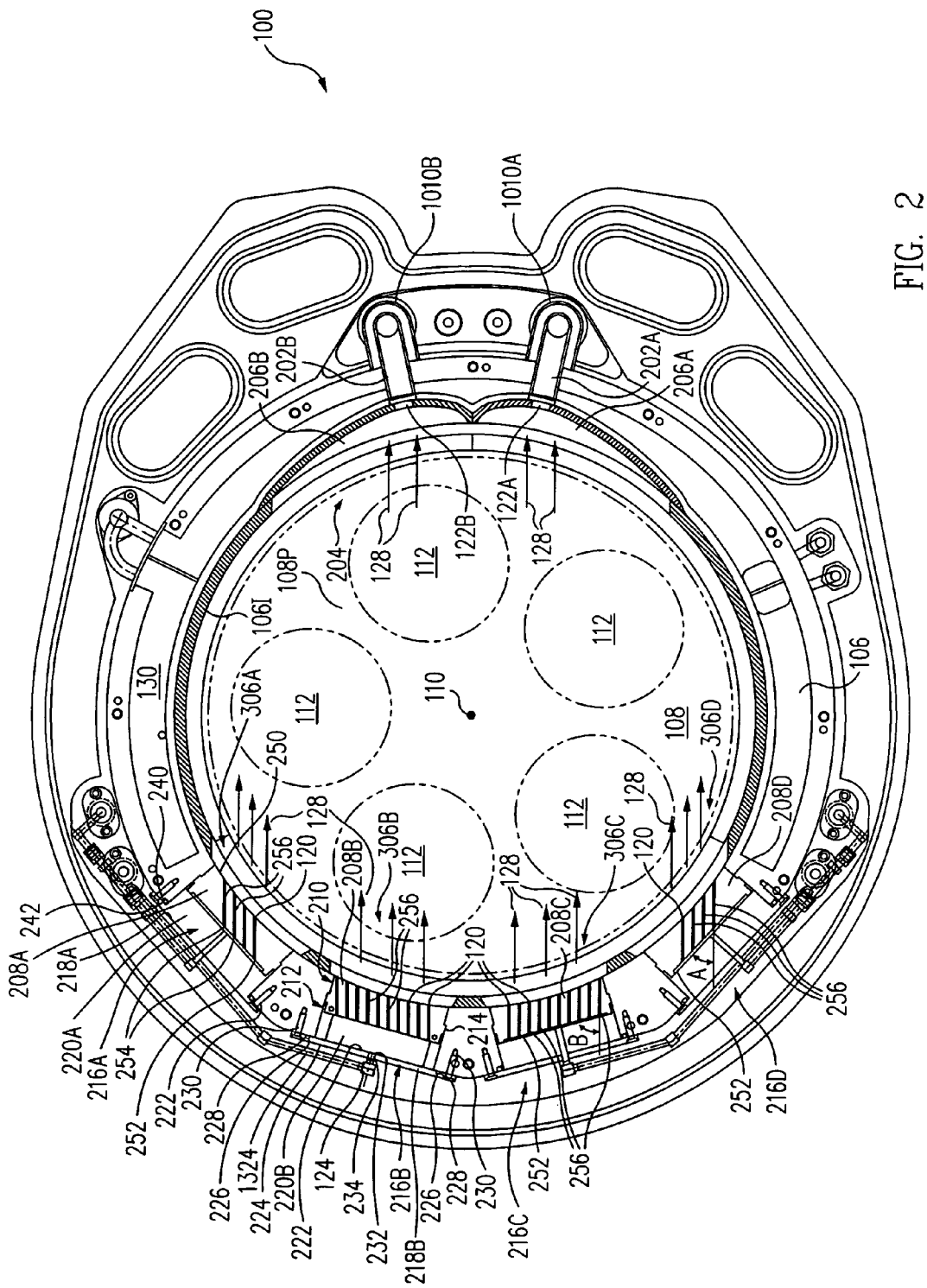
FIG. 2 is a top cross-sectional view of the pancake reactor of FIG. 1.

More particularly, FIG. 1 is a side cross-sectional view of a pancake reactor 100, sometimes called a semiconductor processing reactor, in accordance with one embodiment of the present invention. FIG. 2 is a top cross-sectional view of pancake reactor 100 of FIG. 1.

Referring now to FIGS. 1 and 2 together, pancake reactor 100 includes a base 102, a dome 104, e.g., a quartz bell jar or dome, and a gas ring 106 between base 102 and dome 104. Located within base 102 is a rotating susceptor 108.

Rotating susceptor 108 rotates around an axis 110 of rotating susceptor 108. Rotating susceptor 108 includes substrate holders 112. Substrate holders 112 support substrates (not shown), e.g., silicon wafers, although other substrates are used in other embodiments. Thus, rotation of rotating susceptor 108 also rotates the substrates to optimize the thickness uniformity of layer(s) formed on the substrates. However, in another embodiment, rotating susceptor 108 and thus the substrates are not rotated.

Although five substrate holders 112 are illustrated in FIG. 2, it is understood that more or less than five substrate holders 112, e.g., three, are used in other embodiments.

O-rings 114 are located within circular O-ring grooves 115 of base 102 and form a seal between base 102 and a lower, e.g., first, surface 106L of gas ring 106. Similarly, O-rings 116 are located within circular O-ring grooves 117 of gas ring 106 and form a seal between an upper, e.g., second, surface 106U of gas ring 106 and dome 104.

Accordingly, base 102, gas ring 106, and dome 104 define a reactor volume 118, sometimes called a processing region or space.

Gas ring 106 includes at least one gas injector port 120, hereinafter referred to as gas injector ports 120, and at least one gas exhaust port 122, hereinafter referred to as gas exhaust ports 122. In accordance with this embodiment, gas injector ports 120 and gas exhaust ports 122 lie in a common horizontal plane H parallel to a principal surface 108P of rotating susceptor 108 and are opposite one another. In one embodiment, principal surface 108P lies in a horizontal plane. As used herein, horizontal and similar terms mean in a first direction and vertical and similar terms mean in a second direction perpendicular to the first direction.

During use, process gas is provided to gas ring 106 through at least one gas inlet port 124, hereinafter referred to as gas inlet ports 124, coupled to gas injector ports 120. The process gas exits gas ring 106 through gas injector ports 120 and enters into reactor volume 118.

The process gas flows horizontally from gas injector ports 122 across principal surface 108P of rotating susceptor 108 to exhaust ports 122. The process gas is removed from reactor volume 118 through exhaust ports 122 and enters gas ring 106. The process gas is exhausted from gas ring 106 through at least one gas outlet port 126, hereinafter gas outlet ports 126, coupled to exhaust ports 122.

By locating gas injector ports 120 and gas exhaust ports 122 horizontally opposite one another, the process gas flows horizontally across principal surface 108P of rotating susceptor 108 and thus across the substrates uniformly as indicated by the arrows 128. In one embodiment, the process gas flows horizontally with a laminar or non-turbulent flow, i.e., in a sheet-like flow. This results in the formation of layers on substrates having excellent thickness uniformity.

Further, by reducing or eliminating turbulence in the flow of the process gas through reactor volume 118, dislodgement of particulates and the associated substrate contamination is minimized.

In addition, use of gas ring 106 allows realization of an abrupt transition between layers formed on the substrates. This is because when the process gas is changed to have a new composition, e.g., from a high dopant concentration process gas to a low dopant concentration process gas, the new process gas travels in a uniform horizontal flow through pancake reactor 100 as indicated by the arrows 128.

Accordingly, the composition of the process gas contacting the substrates abruptly changes when the process gas is changed. As a result, an abrupt transition occurs between the layer formed from the process gas having the original gas composition and the new layer formed from the process gas having the new gas composition. Thus, use of gas ring 106 enables formation of substrates having abrupt transitions between layers using a relatively simple, reliable and cost effective pancake reactor 100.

See Moore et al., U.S. Pat. No. 6,475,284, issued Nov. 5, 2002, entitled "GAS DISPERSION HEAD", which is herein incorporated by reference in its entirety, regarding achievement of abrupt transitions between layers on a substrate using uniform gas flow.

Figure 3:
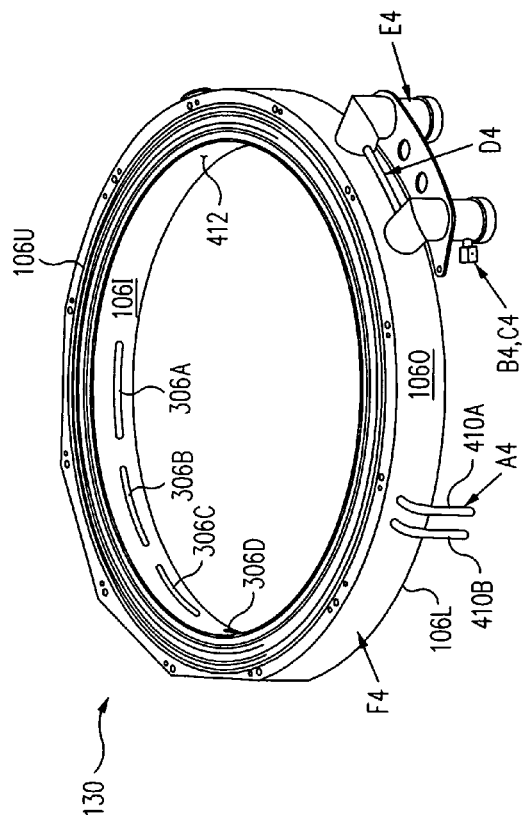
FIGS. 3 and 4 are perspective views from the inlet and outlet side, respectively, of a chassis of a gas ring of FIGS. 1 and 2 in accordance with one embodiment of the present invention.
Figure 4:
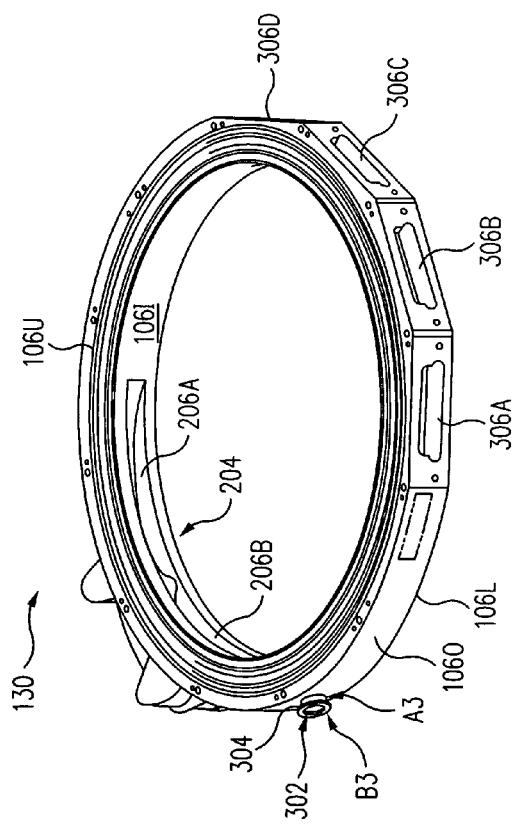

FIGS. 3 and 4 are perspective views from the inlet and outlet side, respectively, of a chassis 130, sometimes called a main weldment, of gas ring 106 of FIGS. 1 and 2 in accordance with one embodiment of the present invention.

Referring now to FIGS. 1, 2, 3 and 4 together, chassis 130, and more generally, gas ring 106, includes upper surface 106U, lower surface 106L, an inner, e.g., third, surface 106I, and an outer, e.g., forth, surface 106O. In accordance with this embodiment, upper and lower surfaces 106U, 106L are annular and lie in horizontal planes. Inner surface 106I and outer surface 106O extend between upper and lower surfaces 106U, 106L and are generally cylindrical.

Figure 5:
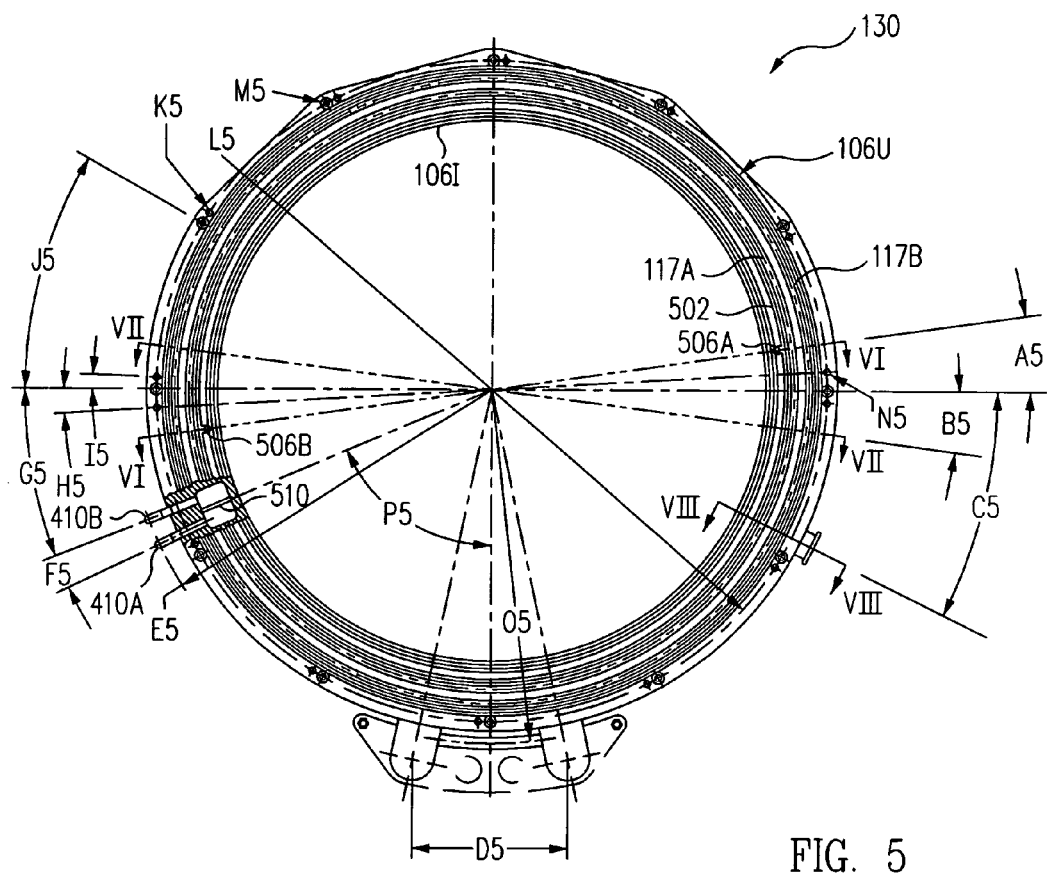
FIG. 5 is a top plan view, partially cutaway, of the chassis of FIGS. 3 and 4 in accordance with one embodiment of the present invention.

FIG. 5 is a top plan view, partially cutaway, of chassis 130 of FIGS. 3 and 4 in accordance with one embodiment of the present invention. FIG. 6 is a cross-sectional view of chassis 130 along the line VI-VI of FIG. 5 in accordance with one embodiment of the present invention.

Referring now to FIGS. 5 and 6 together, upper surface 106U includes O-ring grooves 117A, 117B, collectively referred to as O-ring grooves 117. O-ring grooves 117 are circular and concentric with upper surface 106U.

Upper surface 106U further includes a circular purge groove 502, which is concentric with upper surface 106U and O-ring grooves 117. Purge groove 502 is located inwards closer to inner surface 106I of chassis 130 than O-ring grooves 117, i.e., purge groove 502 has a smaller diameter than either of O-ring grooves 117.

Upper surface 106U further includes upper purge ports 506A, 506B, collectively referred to as upper purge ports 506. Upper purge ports 506 are located within purge groove 502. Although two upper purge ports 506 are illustrated, in one embodiment, only a single purge port 506 is used.

Upper purge ports 506A, 506B are coupled to lower purge ports in 602A, 602B, lower surface 106L by purge port channels 604A, 604B, respectively. Purge port channels 604A, 604B, collectively referred to as purge port channels 604, extend between upper purge ports 506 and lower purge ports 602A, 602B, collectively referred to as lower purge ports 602. In one embodiment, purge port channels 604 are ¼" OD×0.035" WALL 316L SST tubes although other channels are used in other embodiments.

During use, a purge gas, e.g., an inert gas such as argon or nitrogen, is provided to lower purge ports 602 from base 102. The purge gas passes through purge port channels 604 and exits upper purge ports 506 into purge groove 502.

In one embodiment, the pressure of the purge gas in purge groove 502 is greater than the pressure of the process gas within reactor volume 118 such that any leakage of gas is leakage of inert gas into pancake reactor 100 and not leakage of process gas between gas ring 106, base 102 and dome 104.

FIG. 7 is a cross-sectional view of chassis 130 along the line VII-VII of FIG. 5 in accordance with one embodiment of the present invention. Referring now to FIGS. 5 and 7 together, upper surface 106U further includes an upper vacuum port 508. Upper vacuum port 508 is located between O-ring grooves 117A and 117B.

Upper vacuum port 508 is coupled to a lower vacuum port 706 in lower surface 106L by a vacuum port channel 708. Vacuum port channel 708 extends between upper vacuum port 508 and lower vacuum port 706. In one embodiment, vacuum port channel 708 is a ⅛" OD×0.025" Wall 316L SST tube although other channels are used in other embodiments.

During use, vacuum is provided to lower vacuum port 706 from base 102. The vacuum passes through vacuum port channel 708 and exits upper vacuum port 508.

By applying vacuum between O-ring grooves 117A and 117B, any leakage of gas past O-ring grooves 117 is leakage of the gas into upper vacuum port 508 and not vice versa. In this manner, leakage of process gas between gas ring 106, base 102 and dome 104 is redundantly prevented.

Referring now to FIGS. 4, 5 and 6 together, chassis 130 includes first and second cooling fluid couplings 410A, 410B, collectively referred to as cooling fluid couplings 410. Chassis 130 further includes a first internal cooling channel 610 coupled to cooling fluid couplings 410. Internal cooling channel 610 includes split upper and lower channels 612A, 612B as illustrated in FIG. 6.

As shown in the cutaway view of FIG. 5, a baffle 510 is located between cooling fluid couplings 410A, 410B.

During use, water or other cooling fluid, hereinafter referred to as water for simplicity of discussion, is provided to cooling fluid coupling 410A (or 410B). The water passes through cooling fluid coupling 410A (or 410B) and into internal cooling channel 610. Baffle 510 causes the water to flow around the entire circumference of chassis 130 through internal cooling channel 610 and to fluid coupling 410B (or 410A). The water then exits through fluid coupling 410B (or 410A). In one embodiment, chilled water is used.

By passing water through internal cooling channel 610 as discussed above, chassis 130 and thus gas ring 106 is kept cool and prevented from becoming heated. This prevents undesirable deposition on gas ring 106 from the process gas. To further avoid deposition on gas ring 106, in one embodiment, inner surface 106I is provided with a coating of quartz, silicon carbide or other infrared (IR) transparent material. This minimizes heating of inner surface 106I and the associated deposition on inner surface 106I.

Figure 8:
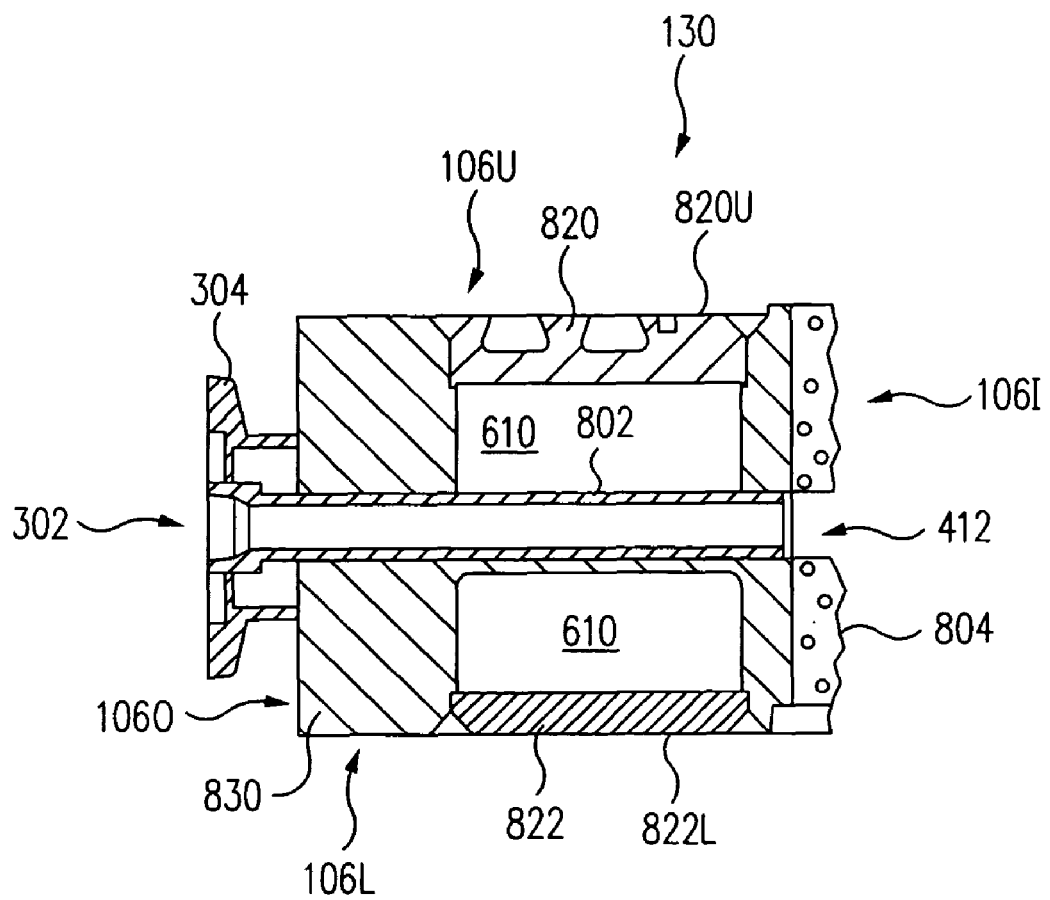
FIG. 8 is a cross-sectional view of the chassis along the line VIII-VIII of FIG. 5 in accordance with one embodiment of the present invention.

FIG. 8 is a cross-sectional view of chassis 130 along the line VIII-VIII of FIG. 5 in accordance with one embodiment of the present invention. Referring now to FIGS. 3, 4, 5 and 8 together, inner surface 106I includes an inner thermocouple port 412 and outer surface 106O includes an outer thermocouple port 302. Inner thermocouple port 412 is coupled to outer thermocouple port 302 by a thermocouple channel 802, e.g., a tube. Thermocouple channel 802 extends between inner thermocouple port 412 and outer thermocouple port 302.

In accordance with this embodiment, a flange 304 located at outer thermocouple port 302 is provided for mounting of a thermocouple (not shown) to gas ring 106.

During use, a thermocouple is passed through outer thermocouple port 302, through thermocouple channel 802 and into pancake reactor 100 through inner thermocouple port 412. A gas tight seal with the thermocouple is formed using flange 304.

Further, as shown in FIG. 8, inner surface 106I is provided with a coating of quartz, silicon carbide or other infrared (IR) transparent material 804. Inner thermocouple port 412 extends through IR transparent material 804.

As also shown in FIG. 8, chassis 130 includes an upper gas ring plate 820 and a lower gas ring plate 822. In this embodiment, upper and lower gas ring plates 820, 822 are annular shaped plates.

An upper surface 820U of upper gas ring plate 820 defines a portion of upper surface 106U of gas ring 106. Similarly, a lower surface 822L of lower gas ring plate 822 defines a portion of lower surface 106L of gas ring 106.

In one embodiment, internal cooling channel 610 is machined into a main body 830 of chassis 130. After formation of internal cooling channel 610, upper and lower gas ring plates 820, 822 are secured, e.g., by welding, to main body 830 of chassis 130 thus sealing internal cooling channel 610. However, in another embodiment, chassis 130 is integral, i.e., is a single piece and not a plurality of separate pieces 820, 822 and 830 coupled together.

Figure 9:
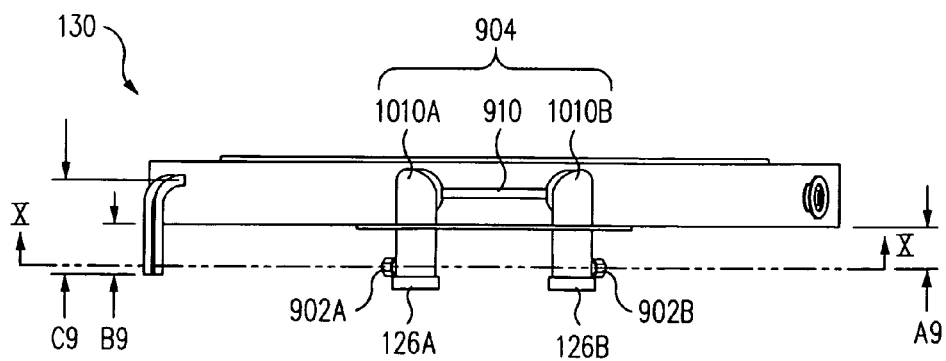
FIG. 9 is a side plan view of the chassis of FIG. 5 in accordance with one embodiment of the present invention.
Figure 10:
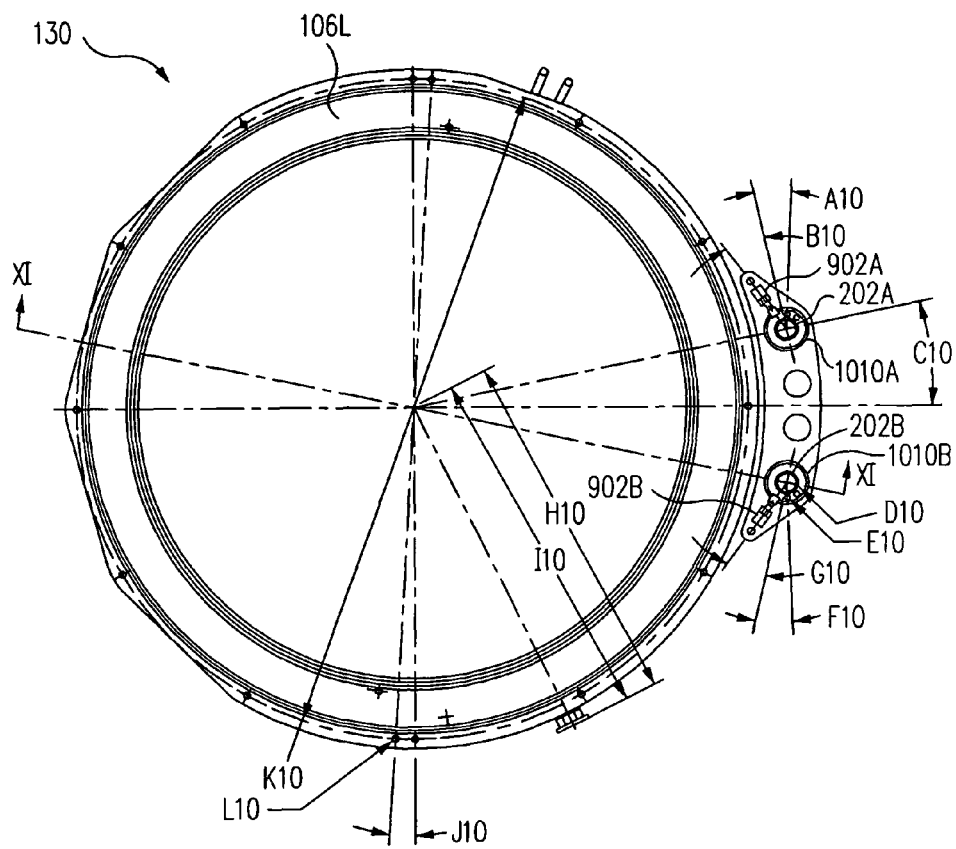
FIG. 10 is a cross-sectional view of the chassis along the line X-X of FIG. 9 in accordance with one embodiment of the present invention.
Figure 11:
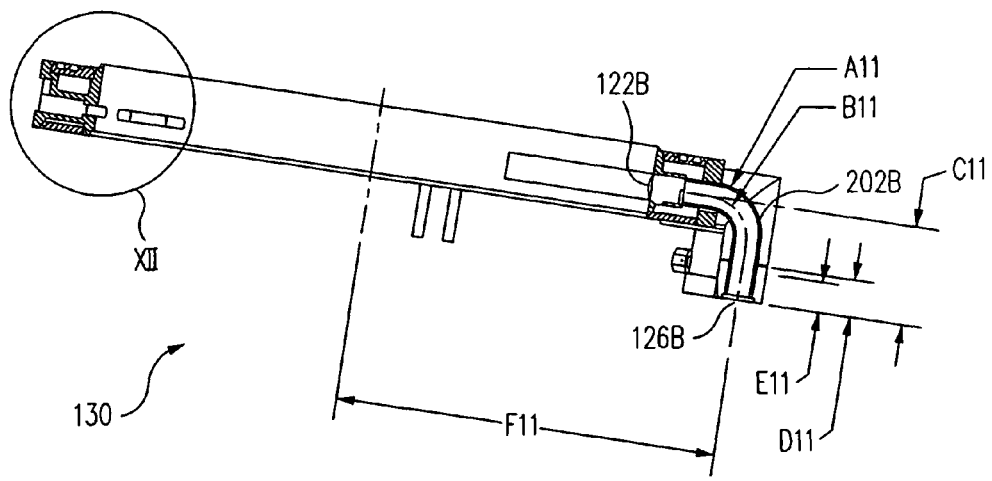
FIG. 11 is a cross-sectional view of the chassis along the line XI-XI of FIG. 10 in accordance with one embodiment of the present invention.

FIG. 9 is a side plan view of chassis 130 of FIG. 5 in accordance with one embodiment of the present invention. FIG. 10 is a cross-sectional view of chassis 130 along the line X-X of FIG. 9 in accordance with one embodiment of the present invention. FIG. 11 is a cross-sectional view of chassis 130 along the line XI-XI of FIG. 10 in accordance with one embodiment of the present invention.

Referring now to FIGS. 2, 9, 10, and 11 together, chassis 130 includes gas outlet ports 126A, 126B, collectively gas outlet ports 126. Gas outlet ports 126 include flanges for coupling an exhaust line (not shown) to gas outlet ports 126.

Gas outlet ports 126A, 126B are coupled to gas exhaust ports 122A, 122B, sometimes called first and second gas exhaust ports, by gas outlet channels 202A, 202B, respectively. In accordance with this embodiment, gas outlet channels 202A, 202B, collectively referred to as gas outlet channels 202, are bent 90 degrees from gas exhaust ports 122 to gas outlet ports 126. More particularly, gas outlet channels 202 are bent from the horizontal to the vertical.

Chassis 130 includes third and fourth cooling fluid couplings 902A, 902B, collectively referred to as cooling fluid couplings 902. Chassis 130 further includes a second internal cooling channel 904 coupled to cooling fluid couplings 902.

Internal cooling channel 904 includes a first jacket 1010A around gas outlet channel 202A, a second jacket 1010B around gas outlet channel 202B, and a jacket connector channel 910, e.g., a tube, coupling jacket 1010A with jacket 1010B.

During use, water or other cooling fluid, hereinafter referred to as water for simplicity of discussion, is provided to cooling fluid coupling 902A (or 902B). The water passes through cooling fluid coupling 902A (or 902B) and into jacket 1010A (or jacket 1010B). The water flows from jacket 1010A (or jacket 1010B) to jacket 1010B (or jacket 1010A) through jacket connector channel 910. The water then exits through cooling fluid coupling 902B (or 902A). In one embodiment, chilled water is used.

By passing water through internal cooling channel 904 as discussed above, gas outlet channels 202 are kept cool and prevented from becoming heated. This prevents undesirable deposition within gas outlet channels 202 from the spent process gas.

Referring now to FIGS. 1 and 10 together, lower surface 106L of gas ring 106 is planar, sometimes called smooth. This facilitates the formation of a gas tight seal with O-rings 114.

In one embodiment, gas ring 106 is provided as a retrofit kit for pancake reactor 100. In accordance with this embodiment, an upper seal surface 102U of base 102 is designed to form a seal with a lower seal surface 104L of dome 104, i.e., pancake reactor 100 is designed to be used without gas ring 106.

However, to facilitate use of gas ring 106, upper surface 106U of gas ring 106 is similar if not identical to upper seal surface 102U of base 102. Similarly, lower surface 106L of gas ring 106 is similar if not identical to lower seal surface 104L of dome 104. Accordingly, pancake reactor is easily retrofit with gas ring 106, and gas ring 106 is thus sometimes called a retrofit gas ring.

However, in another embodiment, gas ring 106 is integral with and forms a part of base 102 and/or dome 104.

Referring now to FIGS. 2, 3 and 4 together, chassis 130 includes a gas exhaust manifold 204 in inner surface 106I. Gas exhaust ports 122 are located within gas exhaust manifold 204.

Gas exhaust manifold 204 is a collector of spent process gas from reactor volume 118. More particularly, gas exhaust manifold 204 includes one or more pockets in inner surface 106I, which function to remove the process gas from reactor volume 118 in a uniform manner.

As shown in FIG. 2, gas exhaust manifold 204 includes a first pocket 206A and a second pocket 206B. Gas exhaust ports 122A, 122B are located within pockets 206A, 206B, respectively.

Chassis 130 further includes four gas injector head ports 306A, 306B, 306C, and 306D, collectively referred to as gas injector head ports 306. Gas injector head ports 306 extend through chassis 130 from outer surface 106O to inner surface 106I. As discussed further below, gas injector heads are mounted within gas injector head ports 306.

Figure 12:
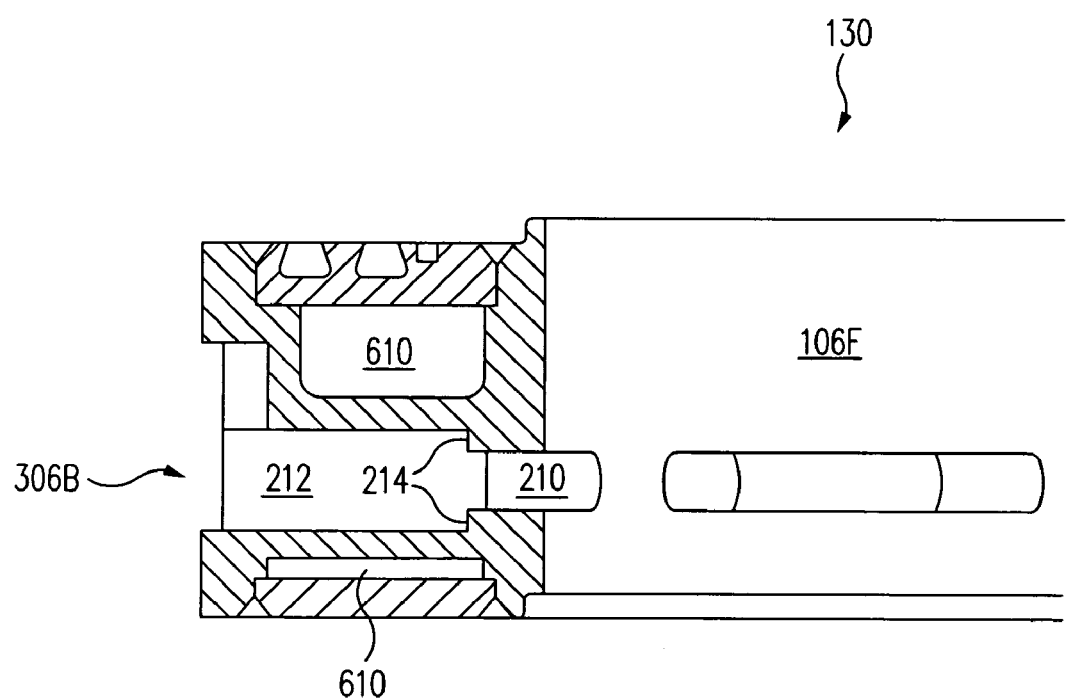
FIG. 12 is an enlarged cross-sectional view of the region XII of the chassis of FIG. 11 in accordance with one embodiment of the present invention.
Figure 13:
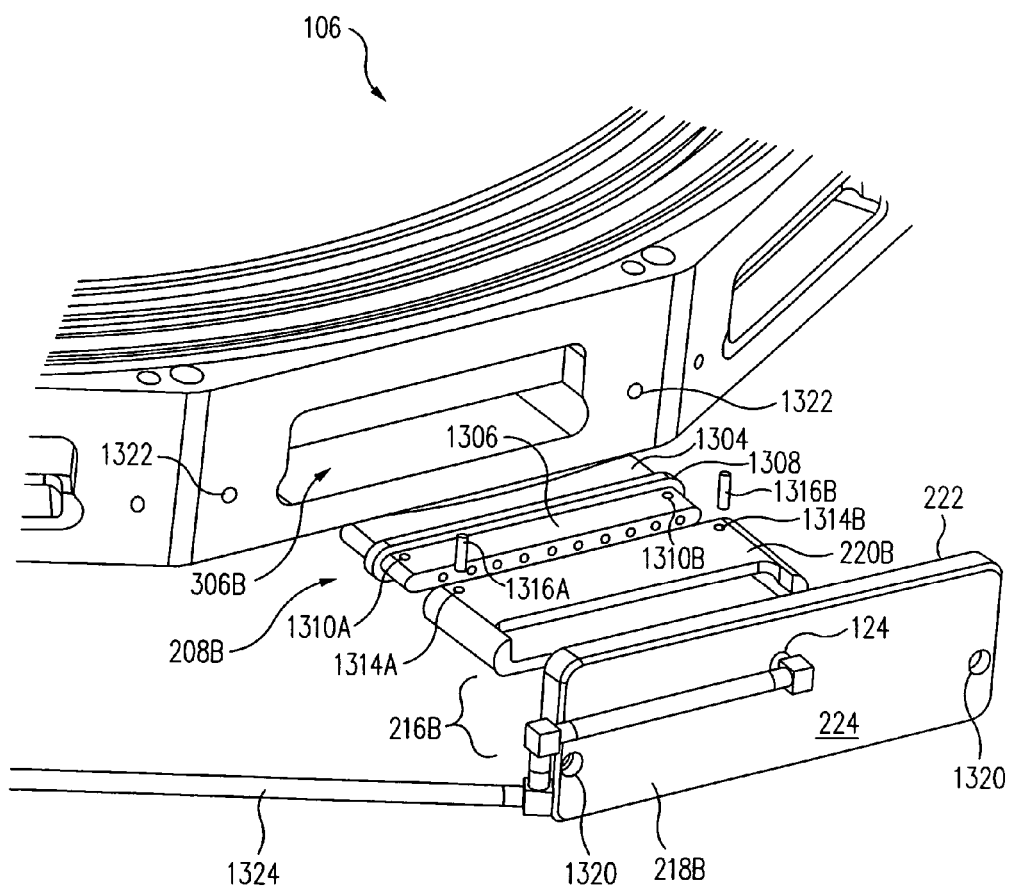
FIG. 13 is an exploded perspective partial view of a gas ring illustrating the mounting of a gas injector head in a gas injector head port in accordance with one embodiment of the present invention.

FIG. 12 is an enlarged cross-sectional view of the region XII of chassis 130 of FIG. 11 in accordance with one embodiment of the present invention. FIG. 13 is an exploded perspective partial view of gas ring 106 illustrating the mounting of a gas injector head 208B in gas injector head port 306B in accordance with one embodiment of the present invention.

Referring now to FIGS. 2, 12 and 13 together, gas injector head port 306B includes a first narrow section 210 and a second wide section 212. Narrow section 210 has a width in both the horizontal and vertical direction less than a width of wide section 212. Accordingly, injector head port 306 includes a vertical stop 214, i.e., a vertical surface, where narrow section 210 joins wide section 212.

Gas injector head 208B includes an inner body section 1304, an outer body section 1306, and a protruding lip 1308, which corresponds with stop 214. More particularly, lip 1308 is located between and protrudes from inner body section 1304 and outer body section 1306. In one embodiment, gas injector head 208B is an integral single piece of quartz, silicon carbide or other infrared (IR) transparent material. This minimizes heating of gas injector head 208B and the associated deposition on gas injector head 208B from the process gas.

To mount gas injector head 208B within gas injector head port 306B, gas injector head 208B is slid into gas injector head port 306B with inner body section 1304 being inserted first. Gas injector head 208B is slid into gas injector head port 306B until lip 1308 butts up against, sometimes called contacts, stop 214. In this manner, gas injector head 208B is precisely positioned within gas injector head port 306B and, more generally, within chassis 130.

Outer body section 1306 includes first and second mounting apertures 1310A, 1310B. A gas injector head mounting assembly 216B includes a seal plate 218B and a gas dispersion manifold 220B. Gas dispersion manifold 220B includes mounting apertures 1314A, 1314B, which correspond to mounting apertures 1310A, 1310B of outer body section 1306.

To mount gas dispersion manifold 220B to gas injector head 208B, mounting apertures 1314A, 1314B of gas dispersion manifold 220B are aligned with mounting apertures 1310A, 1310B of outer body section 1306, respectively.

A pin 1316A is passed through apertures 1314A and 1310A. Similarly, a pin 1316B is passed through apertures 1314B and 1310B. Pins 1316A, 1316B thus mount gas dispersion manifold 220B to gas injector head 208B. Gas dispersion manifold 220B is mounted within gas injector head port 306B along with gas injector head 208B.

As discussed further below, gas injector head 208B includes a plurality of gas injection channels. Gas dispersion manifold 220B is a hollow sleeve, which disperses the process gas to the gas injection channels.

Gas injector head port 306B is sealed at outer surface 106O with seal plate 218B. Seal plate 218B includes an inner, e.g., first, surface 222 and an outer, e.g., second, surface 224.

Inner surface 222 includes an O-ring groove 226 (FIG. 2) in which an O-ring 228 is placed to form a seal between outer surface 106O of chassis 130 and inner surface 222 of seal plate 218B.

Seal plate 218B is mounted to chassis 130 using screws 230, which pass through mounting apertures 1320 of seal plate 218B and into threaded mounting apertures 1322 of chassis 130.

Seal plate 218B further includes a gas inlet port 124 at outer surface 224, coupled to a process gas line 1324. Gas inlet port 124 is coupled to a gas outlet port 232 at inner surface 222 of seal plate 218B by a gas channel 234 of seal plate 218B.

During use, process gas is provided to process gas line 1324. This process gas flows through gas inlet port 124, through gas channel 234 and out of gas outlet port 232 into gas dispersion manifold 220B to gas injector head 208B. As stated above, gas dispersion manifold 220B is a hollow sleeve and distributes the process gas from gas outlet port 232, e.g., a single aperture, to the gas injection channels of gas injector head 208B.

However, in another embodiment, instead of forming gas injector head mounting assembly 216B from a separate seal plate 218B and gas dispersion manifold 220B, gas injector head mounting assembly 216B is a single piece and not a plurality of separate pieces connected together.

To illustrate, referring now to FIG. 2, a second gas injector head mounting assembly 216A is used to mount a second gas injector head 208A. Gas injector head mounting assembly 216A includes an integral seal plate 218A and gas dispersion manifold 220A. Further, outer surface 1060 includes an O-ring groove 240 in which an O-ring 242 is placed to form a seal between outer surface 1060 of chassis 130 and an inner surface 222 of seal plate 218A.

Gas injector head mounting assemblies 216C, 216D are similar to gas injector head mounting assembly 216A and are used to mount gas injector heads 208C, 208D, respectively, in a similar manner.

Referring again to FIG. 2, gas injector head 208A includes an inner surface 250 and an outer surface 252. Inner surface 250 is a concave vertical surface. More particularly, inner surface 250 is a segment of the cylindrical inner surface 106I of chassis 130. Outer surface 252 is a vertical plane in accordance with this embodiment.

Gas injector ports 120 of gas injector head 208A are formed in inner surface 250. Gas injector intake ports 254 are formed in outer surface 252.

Gas injector head 208A includes a plurality of gas injection channels 256 extending from and coupling gas injector intake ports 254 to gas injector ports 120. In one embodiment, gas injection channels 256 are cylindrical apertures, sometimes called passageways, through gas injector head 208A. Although four gas injection channels 256 are illustrated, more, e.g., five or ten, or less than four gas injection channels 256 are formed in other embodiments. For example, a gas injector head having five gas injection channels is illustrated in FIGS. 14-20 in accordance with one embodiment as discussed further below and gas injector head 208B includes ten gas injection channels 256 as shown in FIG. 2.

In one embodiment, referring now to FIGS. 1 and 2 together, gas injection channels 256 lie in a common horizontal plane parallel to a principal surface 108P of rotating susceptor 108 (see FIG. 1). However, in other embodiments, one or more or all of gas injection channels 256 point up and/or down relative to principal surface 108P of rotating susceptor 108.

Further, gas injection channels 256 are angled, i.e., not perpendicular, relative to inner surface 250 and outer surface 252 of gas injector head 208A.

More particularly, referring now to FIG. 2, gas injector heads 208 include gas injection channels 256. Gas injection channels 256 are parallel to one another in accordance with this embodiment. More generally, gas injection channels 256 point across pancake reactor towards gas exhaust ports 122. In this manner, uniform flow of process gas through pancake reactor is achieved.

Since gas injection channels 256 are parallel to one another in accordance with this embodiment, the angle of gas injection channels 256 relative to inner surface 250 and outer surface 252 of gas injector heads 208 depends upon the position of the particular gas injector head 208 on the circumference of gas ring 106.

More particularly, the closer a gas injector head 208 to gas exhaust ports 122, the lesser the angle of gas injection channels 256 relative to inner surface 250 and outer surface 252 of the gas injector head.

To illustrate, an angle A between gas injection channels 256 and outer surface 252 of gas injector head 208D is less than an angle B between gas injection channels 256 and outer surface 252 of gas injector head 208C. Gas injector head 208D is closer to gas exhaust ports 122.

Figure 14:
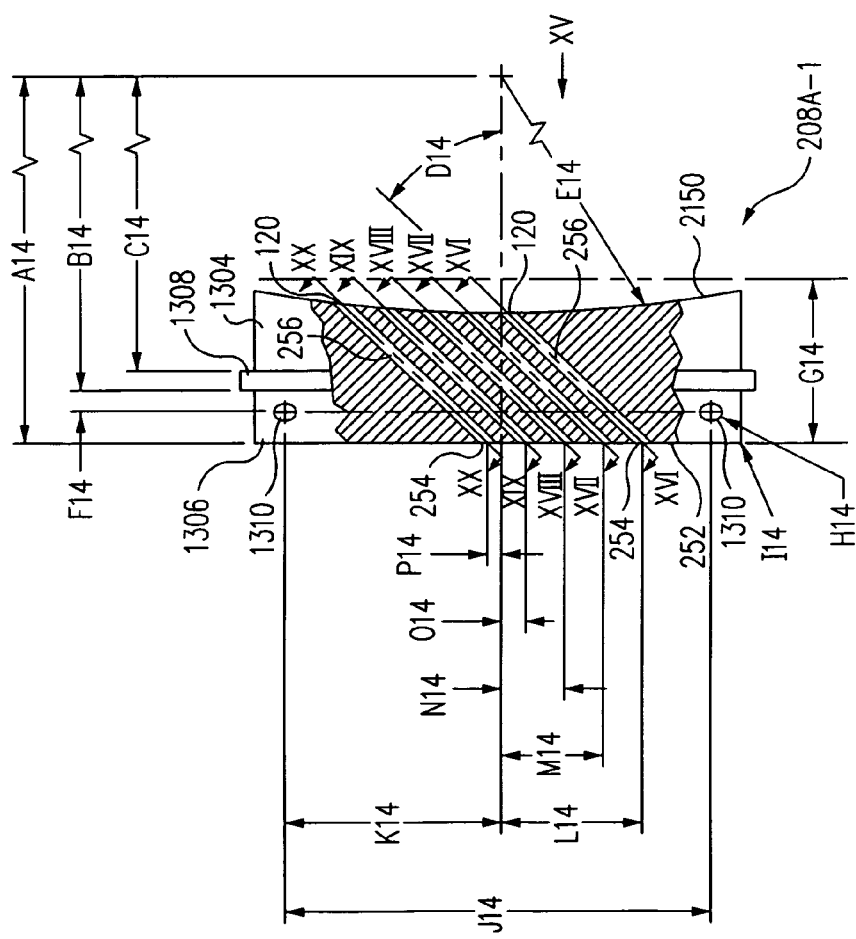
FIG. 14 is a partial cross-sectional view of a gas injector head in accordance with another embodiment of the present invention.

FIG. 14 is a partial cross-sectional view of a gas injector head 208A-1 in accordance with another embodiment of the present invention. Gas injector head 208A-1 is similar to gas injector head 208A of FIG. 2 and only the significant differences are discussed below.

Gas injector head 208A-1 includes inner and outer body sections 1304, 1306, lip 1308 and mounting apertures 1310 as discussed above in reference to FIG. 13.

Further, gas injector head 208A-1 includes an inner surface 250 and an outer surface 252. Inner surface 250 is a concave vertical surface. Outer surface 252 is a vertical plane in accordance with this embodiment.

Gas injector ports 120 of gas injector head 208A-1 are formed in inner surface 250. Gas injector intake ports 254 are formed in outer surface 252.

Gas injector head 208A-1 includes gas injection channels 256 extending from and coupling gas injector intake ports 254 to gas injector ports 120. In this embodiment, gas injection channels 256 are cylindrical apertures, sometimes called passageways, through gas injector head 208A-1. Specifically, gas injector head 208A-1 includes five gas injection channels 256, which lie in a common horizontal plane parallel to a principal surface 108P of rotating susceptor 108 (see FIG. 1) and perpendicular outer surface 252. Further, gas injection channels 256 are parallel to one another and are angled relative to inner surface 250 and outer surface 252 of gas injector head 208A-1.

Figure 15:
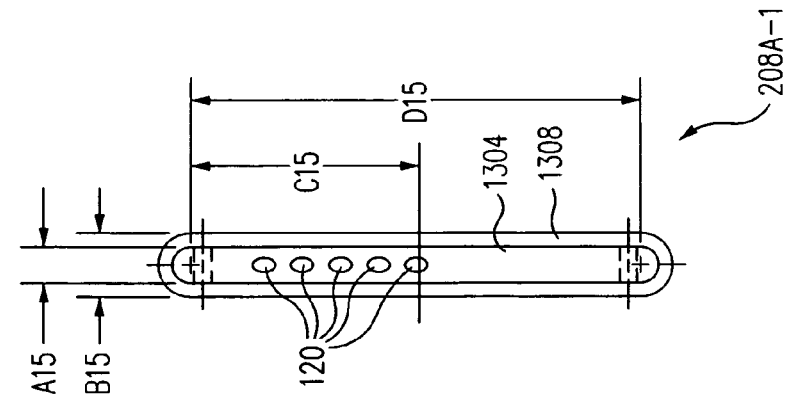
FIG. 15 is a front plan view of the gas injector head along the line XV of FIG. 14 in accordance with one embodiment of the present invention.

FIG. 15 is a front plan view of gas injector head 208A-1 along the line XV of FIG. 14 in accordance with one embodiment of the present invention. As shown in FIG. 15, lip 1308 protrudes from inner body section 1304.

FIGS. 16, 17, 18, 19 and 20 are partial cross-sectional views of gas injector head 208A-1 taken along the lines XVI-XVI, XVII-XVII, XVIII-XVIII, XIX-XIX, XX-XX of FIG. 14, respectively, in accordance with various embodiments of the present invention. Exemplary specifications for the various characteristics illustrated in FIGS. 16, 17, 18, 19, and 20 are set forth below in tables 11, 12, 13, 14, and 15, respectively.

Figure 21:
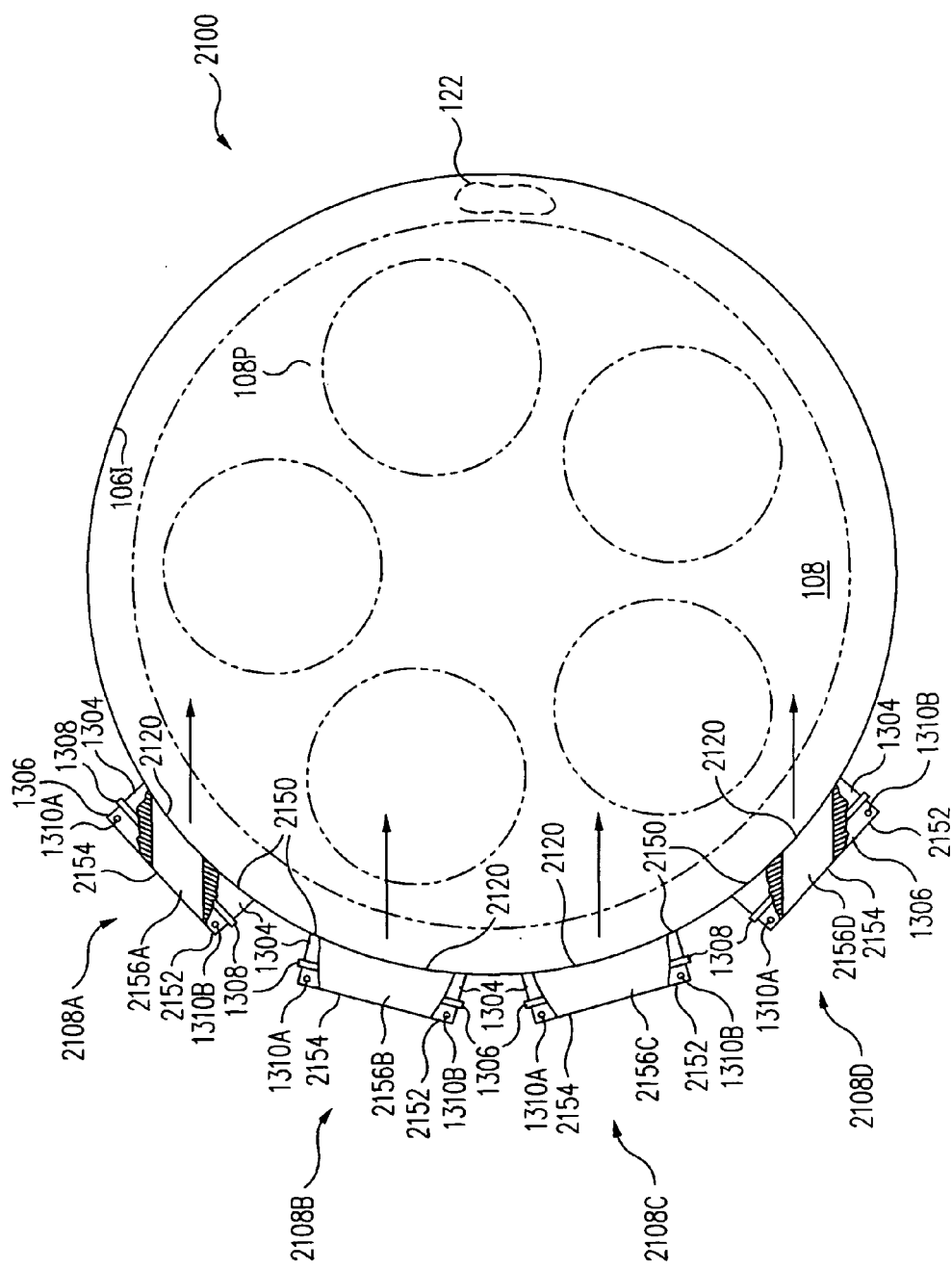
FIG. 21 is a partial top cross-sectional view of a pancake reactor in accordance with one embodiment of the present invention.

FIG. 21 is a partial top cross-sectional view of a pancake reactor 2100 in accordance with one embodiment of the present invention. Pancake reactor 2100 of FIG. 21 is similar to pancake reactor of FIG. 1 and only the significant differences are discussed below and illustrated in FIG. 21.

Referring now to FIG. 21, pancake reactor 2100 includes gas injector heads 2108A, 2108B, 2108C and 2108D, collectively referred to as gas injector heads 2108. In accordance with this embodiment, gas injector heads 2108A, 2108B, 2108C and 2108D each include a single gas injection channel 2156A, 2156B, 2156C, and 2156D, respectively. Gas injection channel 2156A, 2156B, 2156C, 2156D are slots extending through gas injector heads 2108A, 2108B, 2108C and 2108D.

To illustrate, gas injector head 2108A includes an inner surface 2150 and an outer surface 2152. Inner surface 2150 is a concave vertical surface. More particularly, inner surface 2150 is a segment of the cylindrical inner surface 106I of chassis 130 (chassis 130 is shown in FIG. 1). Outer surface 2152 is a vertical plane in accordance with this embodiment.

A gas injector port 2120 of gas injector head 2108A is formed in inner surface 2150. A gas injector intake port 2154 is formed in outer surface 2152.

Gas injector head 2108A includes a single gas injection channel 2156A extending from and coupling gas injector intake port 2154 to gas injector port 2120. In this embodiment, gas injection channel 2156A is a slot, sometimes called passageway, through gas injector head 2108A. Although a single gas injection channel 2156A is illustrated, more than one gas injection channel, i.e., a plurality of slots, is formed in gas injector head 2108A in other embodiments.

The other gas injector heads 2108B, 2108C, 2108D are similar to gas injector head 2108A and so are not discussed in detail to avoid detracting from the principles of the invention.

In one embodiment, gas injection channels 2156 lie in a common horizontal plane parallel to a principal surface 108P of rotating susceptor 108 and perpendicular to outer surface 2152. However, in other embodiments, one or more or all of gas injection channels 2156 point up and/or down relative to principal surface 108P of rotating susceptor 108.

Generally, gas injection channels 2156 point across pancake reactor 2100 towards gas exhaust ports 122. In a manner similar to that discussed above with regards to gas injector heads 208, uniform flow of process gas through pancake reactor 2100 is achieved using gas injector heads 2108.

In a manner similar to that discussed above with regards to gas injector head 208B of FIG. 13, gas injector heads 2108 includes inner body sections 1304, outer body sections 1306, and protruding lips 1308. Further, outer body sections 1306 includes first and second mounting apertures 1310A, 1310B, collectively referred to as mounting apertures 1310.

Figure 22:
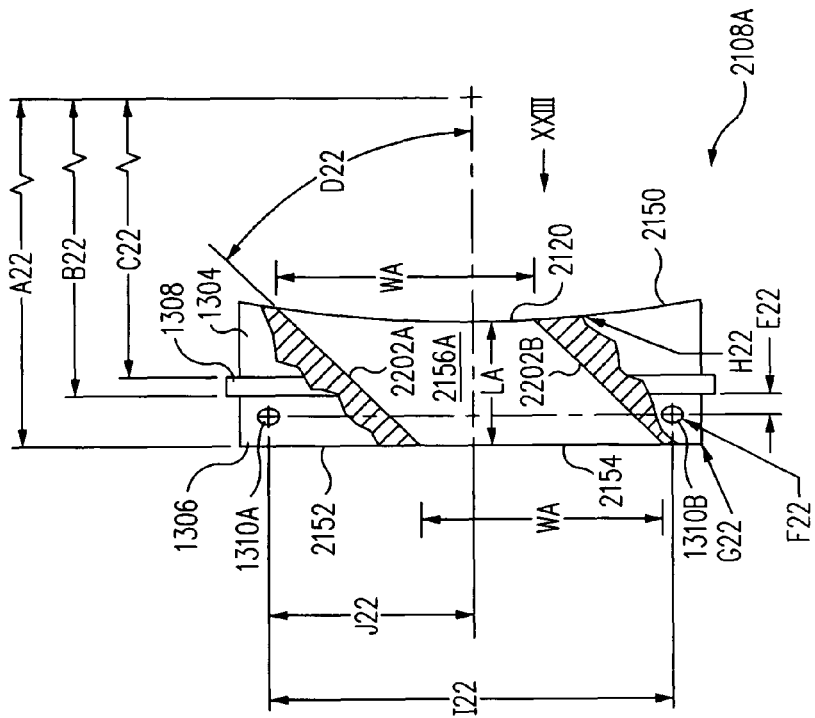
FIG. 22 is a partial top cross-sectional view of a gas injector head of FIG. 21 in accordance with one embodiment of the present invention.
Figure 23:
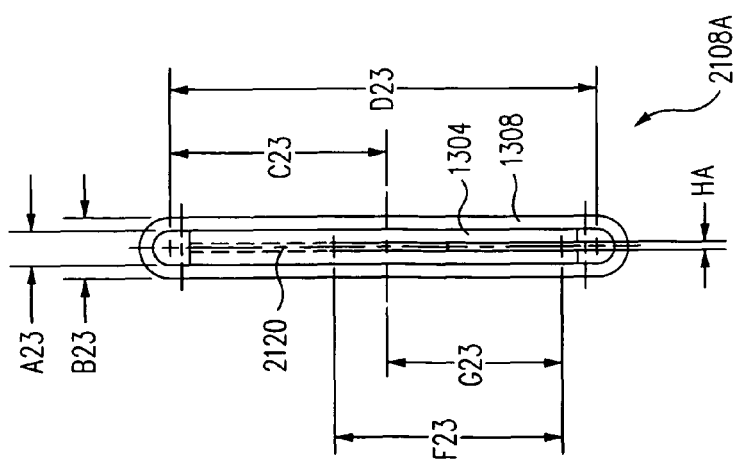
FIG. 23 is a front plan view of the gas injector head along the line XXIII of the pancake reactor of FIG. 22 in accordance with one embodiment of the present invention.

FIG. 22 is a partial top cross-sectional view of gas injector head 2108A of FIG. 21 in accordance with one embodiment of the present invention. FIG. 23 is a front plan view of gas injector head 2108A along the line XXIII of FIG. 22 in accordance with one embodiment of the present invention.

Referring now to FIGS. 22 and 23 together, gas injection channel 2156A of gas injector head 2108A has a width WA, a height HA and a length LA. Width WA is greater than height HA such that gas injection channel 2156A is a slot extending through gas injector head 2108A.

Further, as shown in FIG. 22, width WA is uniform across length LA of gas injection channel 2156A. Further, gas injection channel 2156A is angled relative to inner surface 2150 and outer surface 2152 of gas injector head 2108A. More particularly, vertical sidewalls 2202A, 2202B, collectively referred to as vertical sidewalls 2202, of gas injector head 2108A define width WA of gas injection channel 2156A. Vertical sidewalls 2202 are angled relative to inner surface 2150 and outer surface 2152 of gas injector head 2108A.

Figure 24:
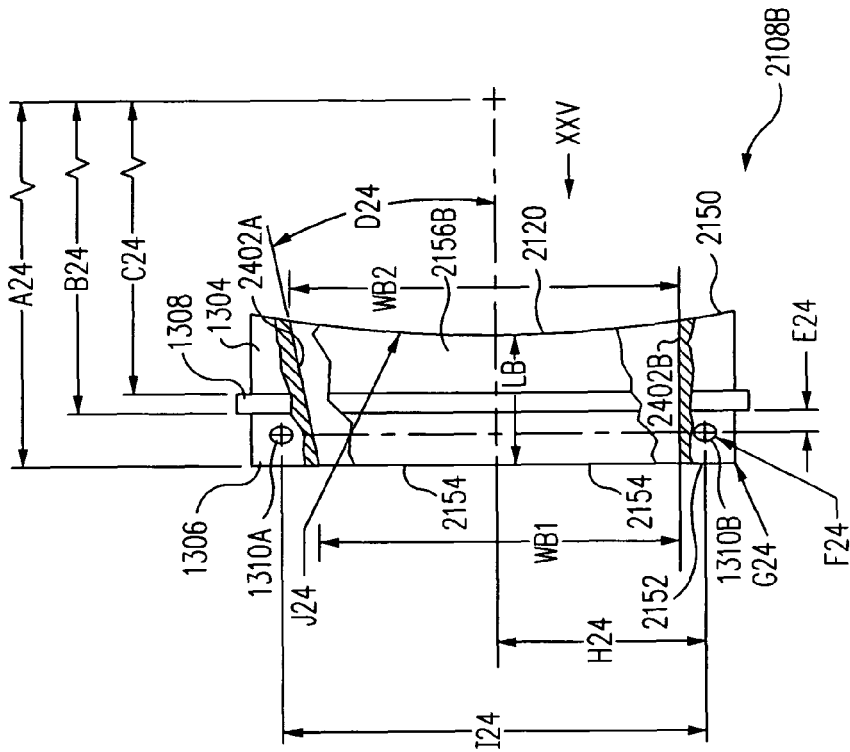
FIG. 24 is a partial top cross-sectional view of a gas injector head of the pancake reactor of FIG. 21 in accordance with another embodiment of the present invention.
Figure 25:
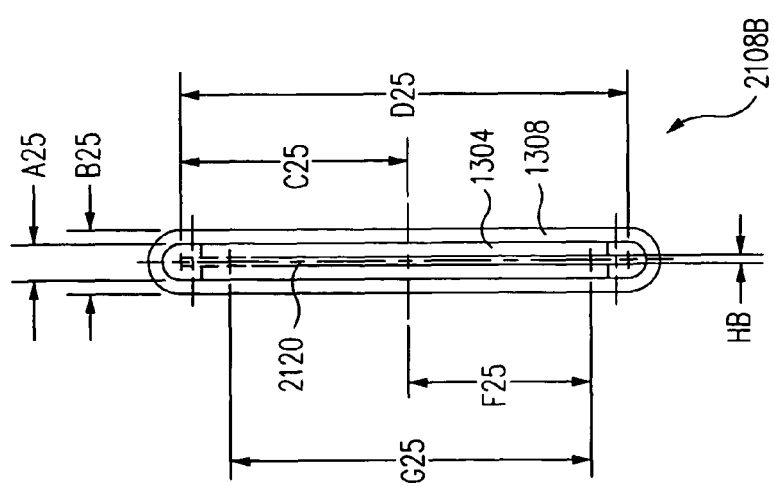
FIG. 25 is a front plan view of the gas injector head along the line XXV of FIG. 24 in accordance with one embodiment of the present invention.

FIG. 24 is a partial top cross-sectional view of gas injector head 2108B of pancake reactor 2100 of FIG. 21 in accordance with another embodiment of the present invention. FIG. 25 is a front plan view of gas injector head 2108B along the line XXV of FIG. 24 in accordance with one embodiment of the present invention.

Referring now to FIGS. 24 and 25 together, gas injection channel 2156B of gas injector head 2108B has a first width WB1 at outer surface 2152 of gas injector head 2108B, a second width WB2 at inner surface 2150 of gas injector head 2108B, a height HB and a length LB. Widths WB1, WB2 are greater than height HB such that gas injection channel 2156B is a slot extending through gas injector head 2108B.

Further, as shown in FIG. 24, first width WB1 at outer surface 2152 of gas injector head 2108B is less than second width WB2 at inner surface 2150. Accordingly, the width of gas injection channel 2156B increases across length LB from outer surface 2152 to inner surface 2150 of gas injection channel 2156B. Thus, gas injection channel 2156B of gas injector head 2108B is a flared slot extending through gas injector head 2108B.

Further, gas injection channel 2156B is partially angled relative to outer surface 2152 of gas injector head 2108B. More particularly, vertical sidewalls 2402A, 2402B of gas injector head 2108B define the width of gas injection channel 2156B. Vertical sidewall 2402A is angled relative to outer surface 2152 of gas injector head 2108B. Further, vertical sidewall 2402B is perpendicular relative to outer surface 2152 of gas injector head 2108B.

In the following tables, all dimensions are in inches unless otherwise noted. Exemplary specifications for the various characteristics illustrated in FIG. 3 are set forth below in table 1.

TABLE 1

| | |
|---|---|
| A3 | Tubing, 1.00 OD × 0.065 wall, 304/316 SST |
| B3 | NW25 Weld Flange, SST |

Exemplary specifications for the various characteristics illustrated in FIG. 4 are set forth below in table 2.

TABLE 2

| | |
|---|---|
| A4 | Tubing, 3/8 OD × .035 wall, 316L SST |
| B4 | Gland, Socket Weld 1/4 tube 316L SST |
| C4 | Nut, 1/4 Female VCO, SST |
| D4 | Tubing, 3/8 OD × .035 wall, 316L SST |
| E4 | Tubing, 1.875 OD × .065 wall, 316L SST |
| F4 | 316L SST |

Exemplary specifications for the various characteristics illustrated in FIG. 5 are set forth below in table 3.

TABLE 3

| | |
|---|---|
| A5 | 7°30' |
| B5 | 7°30' |
| C5 | 27° |
| D5 | (6.415) |
| E5 | R15.00 |
| F5 | 5° |
| G5 | 20° |
| H5 | 3° |
| I5 | 2° |
| J5 | 30° |
| K5 | 12X 5/16 |
| | DO NOT BREAK THROUGH |
| L5 | Ø27.000 |
| M5 | 12X Ø.266 THRU |
| N5 | 2X Ø.2505 + 0.0005 − .0000 |
| O5 | R14.31 |
| P5 | 67°30' |

Exemplary specifications for the various characteristics illustrated in FIG. 6 are set forth below in table 4.

TABLE 4

| | |
|---|---|
| A6 | 2.375 |
| B6 | (22.500) |
| C6 | (Ø23.500) |
| D6 | Ø24.500 |
| E6 | Ø25.625 |
| F6 | (27.875) |

Exemplary specifications for the various characteristics illustrated in FIG. 7 are set forth below in table 5.

TABLE 5

| | |
|---|---|
| A7 | 22.760 + 0.005 −0.000 |

TABLE 5-continued

| | |
|---|---|
| B7 | R.033 |
| C7 | 4X R.015 |
| D7 | (Ø25.063) |
| E7 | 4X 66° |
| F7 | 2X .250 + .004 − .000 TANGENT TO TANGENT |
| G7 | 2X .217 + .005 − .000 |
| H7 | .133 + .005 − .000 |
| I7 | 4X R.06 |

Exemplary specifications for the various characteristics illustrated in FIG. 9 are set forth below in table 6.

TABLE 6

| | |
|---|---|
| A9 | 1.60 |
| B9 | 2X 1.88 |
| C9 | (2X 3.51) |

Exemplary specifications for the various characteristics illustrated in FIG. 10 are set forth below in table 7.

TABLE 7

| | |
|---|---|
| A10 | 12° |
| B10 | 25° |
| C10 | (2X 12°0' ± 0°30') |
| D10 | Baffle, Horizontal, Exhaust Tube, 316L SST |
| E10 | Baffle, Vertical, Exhaust Tube, 316L SST |
| F10 | 12° |
| G10 | 25° |
| H10 | 14.41 |
| I10 | 14.42 |
| J10 | 3° |
| K10 | Ø27.000 |
| L10 | 2X Ø.2505 + .0005 −.0000 |

Exemplary specifications for the various characteristics illustrated in FIG. 11 are set forth below in table 8.

TABLE 8

| | |
|---|---|
| A11 | Tubing, 1.00" OD x .083" wall, 316L SST |
| B11 | 2X R1.50 |
| C11 | 2X 3.56 |
| D11 | 2X 1.13 |
| E11 | 2X .88 |
| F11 | 2X 15.43 ± .01 |

Exemplary specifications for the various characteristics illustrated in FIG. 14 are set forth below in table 9.

TABLE 9

| | |
|---|---|
| A14 | 12.47 |
| B14 | 11.938 |
| C14 | 11.750 |
| D14 | 45° TYP |
| E14 | R11.25 ± .01 |
| F14 | .178 + .000 − .005 |
| G14 | 1.532 |
| H14 | 2X .140 X .203 THRU |
| I14 | 3X .02 X 45° |
| J14 | 3.875 |
| K14 | 1.938 |
| L14 | 1.290 |
| M14 | .930 |
| N14 | .570 |
| O14 | .210 |
| P14 | .150 |

Exemplary specifications for the various characteristics illustrated in FIG. 15 are set forth below in table 10.

TABLE 10

| | |
|---|---|
| A15 | .350 |
| B15 | .600 |
| C15 | 2.055 |
| D15 | 4.110 + .000 − .010 |

Exemplary specifications for the various characteristics illustrated in FIG. 16 are set forth below in table 11.

TABLE 11

| | |
|---|---|
| A16 | 3° |
| B16 | .023 |
| C16 | 1.041 |
| D16 | 1.130 |
| E16 | 5X .031 |
| F16 | Ø.130 TYP |

Exemplary specifications for the various characteristics illustrated in FIG. 17 are set forth below in table 12.

TABLE 12

| | |
|---|---|
| A17 | 3° |
| B17 | .023 |
| C17 | 1.036 |
| D17 | 1.135 |

Exemplary specifications for the various characteristics illustrated in FIG. 18 are set forth below in table 13.

TABLE 13

| | |
|---|---|
| A18 | 3° |
| B18 | .022 |
| C18 | 1.013 |
| D18 | 1.158 |

Exemplary specifications for the various characteristics illustrated in FIG. 19 are set forth below in table 14.

TABLE 14

| | |
|---|---|
| A19 | 15° |
| B19 | .100 |
| C19 | .514 |
| D19 | 1.687 |

Exemplary specifications for the various characteristics illustrated in FIG. 20 are set forth below in table 15.

TABLE 15

| | |
|---|---|
| A20 | 20° |
| B20 | .112 |
| C20 | .414 |
| D20 | 1.786 |

Exemplary specifications for the various characteristics illustrated in FIG. 22 are set forth below in table 16.

TABLE 16

| | |
|---|---|
| A22 | 12.44 |
| B22 | 11.938 |
| C22 | 11.750 |
| D22 | 45° |

TABLE 16-continued

| | |
|---|---|
| E22 | .178 + .000 − .005 |
| F22 | 2X .140 × .203 THRU |
| G22 | 3X .02 × 45° |
| H22 | R11.25 ± .01 |
| I22 | 3.875 |
| J22 | 1.938 |

Exemplary specifications for the various characteristics illustrated in FIG. 23 are set forth below in table 17.

TABLE 17

| | |
|---|---|
| A23 | .350 |
| B23 | .600 |
| C23 | 2.045 |
| D23 | 4.090 + .000 − .010 |
| HA | .070 |
| F23 | 2.250 |
| G23 | 1.750 |

Exemplary specifications for the various characteristics illustrated in FIG. 24 are set forth below in table 18.

TABLE 18

| | |
|---|---|
| A24 | 12.44 |
| B24 | 11.938 |
| C24 | 11.750 |
| D24 | 15° |
| E24 | .178 + .000 − .005 |
| F24 | 2X .140 × .203 THRU |
| G24 | 3X .02 × 45° |
| H24 | 1.938 |
| I24 | 3.875 |
| J24 | R11.25 ± .01 |

Exemplary specifications for the various characteristics illustrated in FIG. 25 are set forth below in table 19.

TABLE 19

| | |
|---|---|
| A25 | .350 |
| B25 | .600 |
| C25 | 2.045 |
| D25 | 4.090 + .000 − .010 |
| HB | .070 |
| F25 | 1.600 |
| G25 | 3.200 |

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising a gas ring, said gas ring comprising:
   gas injector head ports;
   gas injector heads mounted within said gas injector head ports, said gas injector heads comprising:
      gas injector ports;
      concave vertical surfaces; and
      gas injector intake ports coupled to said gas injector ports by cylindrical gas injection channels, said gas injection channels being parallel to one another and angled relative to said concave vertical surfaces; and
   at least one gas exhaust port, said gas injector ports being opposite said at least one gas exhaust port.

2. The structure of claim 1 further comprising a susceptor comprising a principal surface, said gas injector ports and said at least one gas exhaust port lying in a common plane parallel to said principal surface.

3. The structure of claim 2 wherein said principal surface lies in a horizontal plane.

4. The structure of claim 3 wherein said gas injector ports and said at least one gas exhaust port are horizontally opposite one another.

5. The structure of 1 further comprising:
   a base coupled to said gas ring; and
   a dome coupled to said gas ring, wherein said gas ring is located between said base and said dome.

6. The structure of claim 5 wherein said base, said gas ring, and said dome define a reactor volume.

7. The structure of claim 1 wherein said gas ring comprises:
   an annular upper surface;
   an annular lower surface;
   a cylindrical inner surface extending between said annular upper surface and said annular lower surface; and
   a cylindrical outer surface extending between said annular upper surface and said annular lower surface.

8. The structure of claim 7 further comprising a first O-ring groove and a second O-ring groove in said annular upper surface.

9. The structure of claim 8 further comprising a purge groove in said annular upper surface inwards of said first O-ring groove and said second O-ring groove.

10. The structure of claim 9 further comprising:
    an upper purge port in said purge groove;
    a lower purge port in said annular lower surface; and
    a purge port channel extending between said upper purge port and said lower purge port.

11. The structure of claim 8 further comprising:
    an upper vacuum port in said annular upper surface between said first O-ring groove and said second O-ring groove;
    a lower vacuum port in said annular lower surface; and
    a vacuum port channel extending between said upper vacuum port and said lower vacuum port.

12. The structure of claim 7 wherein said inner surface comprises an infrared (IR) transparent material.

13. The structure of claim 7 further comprising:
    an inner thermocouple port in said inner surface;
    an outer thermocouple port in said outer surface; and
    a thermocouple channel coupling said inner thermocouple port to said outer thermocouple port.

14. The structure of claim 1 wherein said at least one gas exhaust port comprises a first gas exhaust port, said structure further comprising a gas outlet port coupled to said first gas exhaust port by a gas outlet channel.

15. The structure of claim 14 further comprising an internal cooling channel comprising a jacket around said gas outlet channel.

16. The structure of claim 1 further comprising a gas exhaust manifold, said at least one gas exhaust port being located within said gas exhaust manifold.

17. The structure of claim 16 wherein said gas exhaust manifold comprises a first pocket, said at least one gas exhaust port comprising a first gas exhaust port located within said first pocket.

18. The structure of claim 1 wherein said gas ring comprises a first internal cooling channel.

19. The structure of claim 18 wherein said gas ring comprises:

a main body;

an upper gas ring plate coupled to said main body;

a lower gas ring plate coupled to said main body, wherein said upper gas ring plate and said lower gas ring plate seal said internal cooling channel.

20. A structure comprising:

a base comprising an upper seal surface;

a dome comprising a lower seal surface; and a gas ring between said base and said dome, said gas ring comprising:

an upper surface similar to said upper seal surface of said base; and a lower surface similar to said lower seal surface of said dome, wherein said upper seal surface of said base is designed to form a seal with said lower seal surface of said dome without use of said gas ring, said gas ring being retrofit between said upper seal surface of said base and said lower seal surface of said dome.

21. The structure of claim 20 wherein said gas ring further comprises:

a gas injector head port;

a gas injector head mounted within said gas injector head port, said gas injector head comprising at least one gas injector port.

22. The structure of claim 21 wherein said gas injector head port comprises a stop and wherein said gas injector head comprises a protruding lip in contact with said stop.

23. The structure of claim 21 wherein said gas injector head comprises an infrared (IR) transparent material.

24. The structure of claim 21 further comprising a gas injector head mounting assembly.

25. The structure of claim 24 wherein said gas injector head mounting assembly comprises a gas dispersion manifold for dispersing gas to at least one gas injection channel of said gas injector head.

26. The structure of claim 25 wherein said gas dispersion manifold is coupled to said gas injector head by pins passing through corresponding mounting apertures of said gas dispersion manifold and said gas injector head.

27. The structure of claim 24 wherein said gas injector head mounting assembly comprises a seal plate for sealing said gas injector head at an outer surface of said gas ring.

28. The structure of claim 21 wherein said gas injector head comprises a concave vertical surface.

29. The structure of claim 28 wherein said at least one gas injector port is formed in said concave vertical surface.

30. The structure of claim 29 wherein said gas injector head comprises at least one gas injector intake port coupled to said at least one gas injector port by at least one gas injection channel.

31. The structure of claim 30 wherein said at least one gas injection channel comprises a slot extending through said gas injector head.

32. The structure of claim 31 wherein said slot has a uniform width.

33. The structure of claim 31 wherein said slot is flared from a first width to a second width.

34. The structure of claim 20 wherein said upper surface of said gas ring is identical to said upper seal surface of said base and said lower surface of said gas ring is identical to said lower seal surface of said dome.

35. A method comprising:

providing a process gas to a reactor volume through gas injector ports of a gas ring, said gas ring further comprising:

gas injector head ports;

gas injector heads mounted within said gas injector head ports, said gas injector heads comprising:

said gas injector ports;

concave vertical surfaces; and gas injector intake ports coupled to said gas injector ports by cylindrical gas injection channels, said gas injection channels being parallel to one another and angled relative to said concave vertical surfaces; and removing said process gas from said reactor volume through at least one exhaust port of said gas ring, said gas injector ports and said at least one gas exhaust port being in a horizontal plane.

36. The method of claim 35 wherein said process gas flows horizontally from said gas injector ports across a principal surface of a rotating susceptor to said at least one gas exhaust port.

* * * * *